US009529269B2

(12) United States Patent
Baselmans et al.

(10) Patent No.: US 9,529,269 B2
(45) Date of Patent: Dec. 27, 2016

(54) LITHOGRAPHIC APPARATUS AND DEVICE MANUFACTURING METHOD

(71) Applicant: ASML Netherlands B.V., Veldhoven (NL)

(72) Inventors: Johannes Jacobus Matheus Baselmans, Oirschot (NL); Erik Roelof Loopstra, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 73 days.

(21) Appl. No.: 14/398,047

(22) PCT Filed: May 7, 2013

(86) PCT No.: PCT/EP2013/059434
§ 371 (c)(1),
(2) Date: Oct. 30, 2014

(87) PCT Pub. No.: WO2013/174646
PCT Pub. Date: Nov. 28, 2013

(65) Prior Publication Data
US 2015/0131067 A1 May 14, 2015

Related U.S. Application Data

(60) Provisional application No. 61/651,435, filed on May 24, 2012.

(51) Int. Cl.
*G03B 27/32* (2006.01)
*G03B 27/52* (2006.01)
(Continued)

(52) U.S. Cl.
CPC ....... *G03F 7/70058* (2013.01); *G03F 7/70266* (2013.01); *G03F 7/70308* (2013.01); *G03F 9/7026* (2013.01)

(58) Field of Classification Search
CPC .............. G03F 7/70058; G03F 7/70266; G03F 7/70308; G03F 9/7026
(Continued)

(56) References Cited

U.S. PATENT DOCUMENTS 4,600,275 A 7/1986 Iizuka
4,676,631 A 6/1987 Kosugi et al.
(Continued)

FOREIGN PATENT DOCUMENTS

JP S58-072127 4/1983
JP S61-278141 12/1986
(Continued)

OTHER PUBLICATIONS

International Search Report and Written Opinion mailed Sep. 23, 2013 in corresponding International Patent Application No. PCT/EP2013/059434.

*Primary Examiner* — Colin Kreutzer
(74) *Attorney, Agent, or Firm* — Pillsbury Winthrop Shaw Pittman LLP

(57) ABSTRACT

A field manipulator to provide high resolution control of position in the XY plane and/or focus control. The field manipulator includes a plate located between the patterning device and the substrate. Control of the XY position is provided by tilting of the plate, while control of the focus position may be provided by localized deformation of the plate. Both adjustments may be performed by one or more actuators that act upon one or more edges of the plate. In an embodiment, two substantially parallel plates are provided and focus control can be provided by changing the spacing between them. A liquid may be provided between the plates which may be temperature controlled to adjust the focus by changing the refractive index of the liquid.

20 Claims, 4 Drawing Sheets

(51) Int. Cl.
*G03B 27/54* (2006.01)
*G03F 7/20* (2006.01)
*G03F 9/00* (2006.01)

(58) Field of Classification Search
USPC .................................................. 355/55, 67, 77
See application file for complete search history.

(56) References Cited

U.S. PATENT DOCUMENTS

| | | | | |
|---|---|---|---|---|
| 4,965,630 | A * | 10/1990 | Kato | G03F 7/70241 355/52 |
| 5,557,469 | A * | 9/1996 | Markle | G02B 13/22 359/676 |
| 6,088,080 | A * | 7/2000 | Itoh | G03F 7/70241 355/30 |
| 2002/0008861 | A1 * | 1/2002 | Singer | G02B 3/14 355/53 |
| 2003/0095342 | A1 * | 5/2003 | Matsumoto | G03F 7/70258 359/793 |
| 2003/0227607 | A1 * | 12/2003 | Kato | G03F 7/70058 355/53 |
| 2005/0117138 | A1 * | 6/2005 | Aoki | G03F 7/70808 355/67 |
| 2005/0219707 | A1 | 10/2005 | Schuster et al. | |
| 2007/0177122 | A1 | 8/2007 | Loopstra et al. | |
| 2007/0247605 | A1 * | 10/2007 | Loopstra | G03B 27/52 355/55 |
| 2008/0239503 | A1 | 10/2008 | Conradi et al. | |
| 2009/0153829 | A1 | 6/2009 | Rogalsky et al. | |
| 2009/0213352 | A1 | 8/2009 | Goehnermeier | |
| 2009/0244509 | A1 | 10/2009 | Limbach et al. | |
| 2009/0284831 | A1 | 11/2009 | Schuster et al. | |
| 2010/0014065 | A1 | 1/2010 | Gruner et al. | |
| 2010/0195076 | A1 * | 8/2010 | Mueller | G03F 1/64 355/67 |
| 2011/0019169 | A1 | 1/2011 | Conradi et al. | |
| 2011/0069295 | A1 | 3/2011 | Kraehmer et al. | |
| 2011/0122383 | A1 | 5/2011 | Grejda et al. | |
| 2011/0292361 | A1 * | 12/2011 | Watanabe | G03F 7/70783 355/52 |
| 2011/0299053 | A1 * | 12/2011 | Steinbach | G02B 26/06 355/67 |
| 2014/0327892 | A1 * | 11/2014 | Walter | G02B 7/028 355/30 |
| 2015/0022792 | A1 * | 1/2015 | Gorkhover | G03F 7/70266 355/52 |

FOREIGN PATENT DOCUMENTS

| | | |
|---|---|---|
| JP | H11-121322 | 4/1999 |
| TW | 200835952 | 9/2008 |
| WO | 2008/080537 | 7/2008 |

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/059434, which was filed on May 7, 2013, which claims the benefit of priority of U.S. provisional application No. 61/651,435, which was filed on May 24, 2012, which is incorporated herein in its entirety by reference.

FIELD

The present invention relates to a lithographic apparatus, a method for manufacturing a device, and a field manipulator to provide position control and/or focus control.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning" direction) while synchronously scanning the substrate parallel or anti-parallel to this direction.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

Where a laser is used to print the pattern, the wavelength cannot be significantly altered. Techniques are known for lowering the Rayleigh constant $k_1$ but a common way of improving the pattern resolution is by increasing the numerical aperture NA.

SUMMARY

With the use of, for example, extreme ultraviolet (EUV) radiation in lithography, critical dimensions are becoming ever smaller and the performance demanded of lithographic systems is becoming ever more rigorous. There is an increasing need to provide high resolution control in the projection system of one or more parameters such as focus and/or position in the XY plane in particular to provide a high overlay performance. For example, pure focus manipulation can be used to handle edge roll off effects, while XY position manipulation can be used for intra-field high order position correction techniques.

A further issue is the limited space available in a projection system for multiple manipulators. It would be desirable, for example, to provide a single manipulator that is able to provide both XY position control and focus control.

According to an aspect, there is provided a lithographic apparatus comprising: a substrate table constructed to hold a substrate; a projection system configured to project a patterned radiation beam onto a target portion of the substrate, the projection system having an optical axis; and a field manipulator comprising a pair of substantially parallel plates and an actuator configured to act on the plates to adjust the position of the radiation beam in a plane orthogonal to the optical axis, and/or to adjust the focus of the radiation beam.

In an embodiment, the field manipulator is located in a field plane. For example the field manipulator may be located between the projection system and a support structure configured to support a patterning device used to pattern the radiation beam. In an embodiment, the field manipulator may be located between the projection system and the substrate table.

In an embodiment, the actuator is configured to tilt the plates relative to the plane to adjust the position of the radiation beam in the orthogonal plane.

In an embodiment, the actuator is configured to deform the curvature of at least one of the plates to adjust the focus of the radiation beam. For example the actuator may comprise a plurality of actuators provided along at least one side edge of at least one of the plates to deform the at least one plate.

In an embodiment, the actuator is configured vary the spacing between the plates. In an embodiment, the spacing between the plates is varied in a localized area only. The localized spacing variation may be provided by deforming at least one of the plates.

In an embodiment, there may be provided two pairs of plates with one plate in each pair facing each other, wherein at least one of the facing plates is connected to an actuator. In an embodiment, the facing plates define between them an optically active element. In an embodiment, the space between the facing plates may be filled with a gas (e.g. air or another gas). For example the facing plates may be concave and define between them a lenticular space.

In an embodiment, a liquid is provided between the plates. In an embodiment, a temperature controller may be provided to control the temperature of the liquid. The liquid may be water.

In an embodiment, the plates are rectangular.

In an embodiment, there may be provided a detector configured to detect a focus error and/or an overlay error, and a controller to control the actuator in response to a detected error.

According to another aspect, there is provided a method of manufacturing a device using a lithographic apparatus, the method comprising: projecting a patterned radiation beam from a patterning device through a projection system onto a target portion of a substrate; and acting on, using an actuator, a pair of substantially parallel plates of a field manipulator to control the position of the radiation beam in a plane orthogonal to an optical axis, and/or to control the focus of the radiation beam.

According to another aspect of the present invention there is provided a field manipulator to provide position and focus control of a radiation beam, the field manipulator comprising a pair of substantially parallel plates and an actuator configured to act on the plates to adjust the position of the radiation beam in a plane orthogonal to an optical axis, and/or to adjust the focus of the radiation beam.

BRIEF DESCRIPTION OF THE DRAWINGS

Some embodiments of the invention will now be described by way of reference to the accompanying drawings, in which.

DETAILED DESCRIPTION

Figure 1:
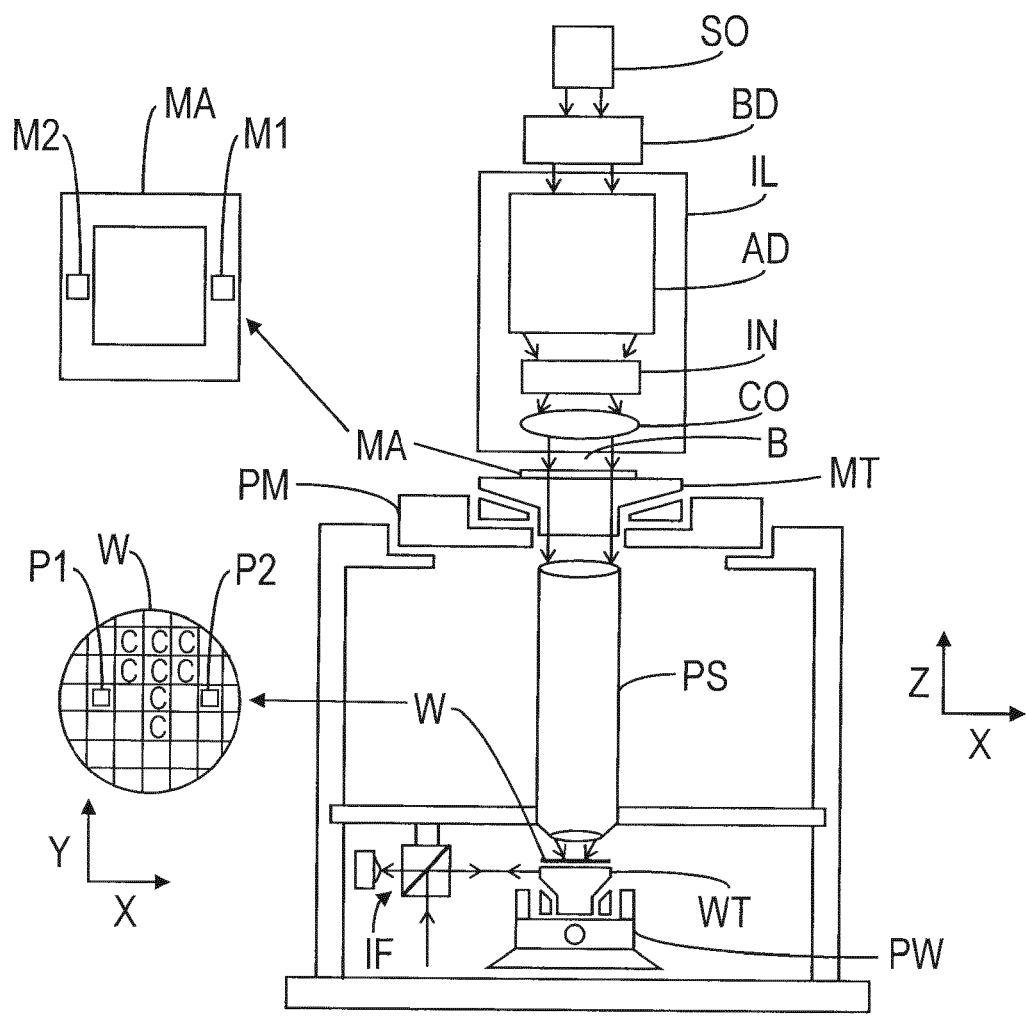
FIG. 1 is a schematic view of a lithographic apparatus according to an embodiment of the invention.

FIG. 1 schematically illustrates a lithographic apparatus according to an embodiment of the invention. The apparatus includes an illumination system IL adapted to condition a beam B of radiation (e.g. EUV radiation) and a support structure MT (such as a mask table) configured to hold a patterning device MA (such as a mask) and connected to a first positioning device PM configured in conjunction with alignment marks M1,M2 to accurately position the patterning device with respect to a projection system PS. The projection system PS is adapted to transfer (e.g., image) a pattern imparted to the beam B by the patterning device MA onto a target portion C of a substrate W. The apparatus also includes a substrate table WT (such as a wafer table) configured to hold the substrate W (such as a resist coated wafer) and connected to a second positioning device PW configured in conjunction with alignment marks P1,P2 to accurately position the substrate with respect to the projection system PS.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination reaching optical components of the lithographic apparatus.

The lithographic apparatus may be of a type having two (dual stage) or more tables (e.g., two or more substrate table and/or two or more mask tables). In such "multiple stage" machines the additional tables may be used in parallel, or preparatory steps may be carried out on one or more tables while one or more other tables are being used for exposure.

As depicted in FIG. 1 the apparatus is of a transmissive type employing a transmissive mask MA. Alternatively the apparatus could be of a reflective type employing a programmable mirror array.

The illuminator IL receives a beam of radiation from a radiation source SO. The illuminator IL comprises an adjustment device AD configured to set an outer and/or inner radial extent, an integrator IN and a condenser CO. Also provided is a beam delivery system BD including for example suitable directing mirrors and/or a beam expander. The source SO and the beam delivery system BD combine to form a radiation system that presents a suitable beam of radiation to the projection system.

The projection system PS may include a diaphragm with an adjustable clear aperture used to set the numerical aperture of the projection system PS at substrate level at a selected value.

The beam of radiation B is incident on the patterning device MA which is held on the support structure MT. Having traversed the patterning device, the beam of radiation B passes through the projection system PS which focuses the beam onto a target portion C of the substrate W. With the aid of a second positioning device PW, alignment marks P1,P2 and position sensor IF (e.g. an interferometric device) the substrate table WT can be moved accurately so as to position different target portions C in the path of the beam B. Similarly, the first positioning device PM, alignment marks M1,M2 and another position sensor can be used to accurately position the patterning device MA with respect to the path of the beam B. In general, movement of the support structure MT and the substrate table WT will be realized with the aid of a long-stroke module for coarse poisoning and a short-stroke module for fine positioning. However, in the case of a stepper (as opposed to a scanner) the support structure may be connected to a short stroke actuator only or may be fixed.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The accuracy of the projection system is a significant factor in the performance of a lithographic apparatus. An error in the projection system can arise from a number of factors both internal and external to the projection system and it is desirable to provide a way to correct for such an error. In particular, for example, it is desirable to provide a way to both control XY position and manipulate the focus. This is desired in particular to meet increasingly exacting overlay performance as critical dimensions decrease. Overlay performance relates to the accuracy to which multiple layers of a device can be constructed. After the formation of one layer, the subsequent layer is formed with increasingly high accuracy relative to the first layer.

For example, a known phenomenon is edge roll off. A variation in geometric consistency at the near-edge region of a substrate (which may be defined as being a distance of 1 mm to 5 mm from the edge) can cause a problem because of the variation near the edge compared to the center of the substrate. The resulting shape or thickness variation is known as edge roll off (ERO) and this may affect lithography focus control. Therefore, it is desirable to provide fine focus control.

Additionally or alternatively, it is desirable to provide a device to provide control of XY position for use in, for example, intra-field high order position correction schemes in which overlay error can be corrected.

In an embodiment, there is provided a field manipulator that is able to control both XY position and defocus with a high spatial resolution.

Figure 2:
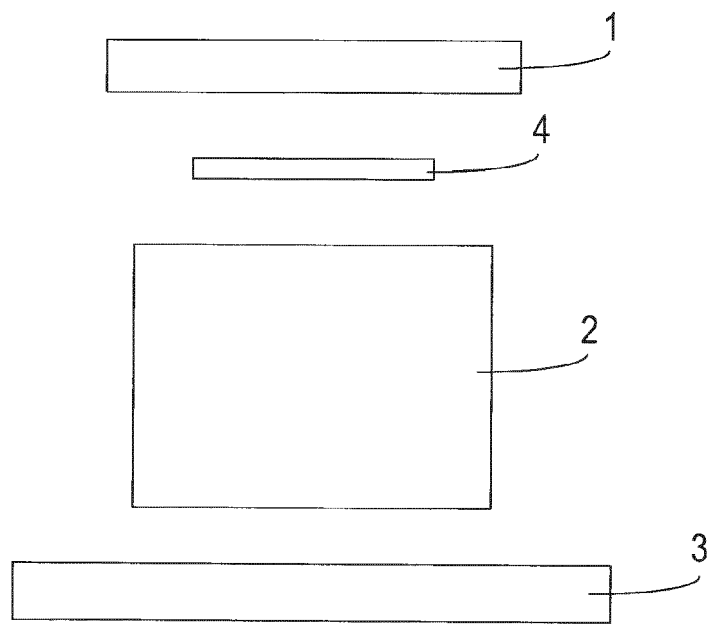
FIG. 2 is a schematic illustration of an embodiment of the present invention.
Figure 3:
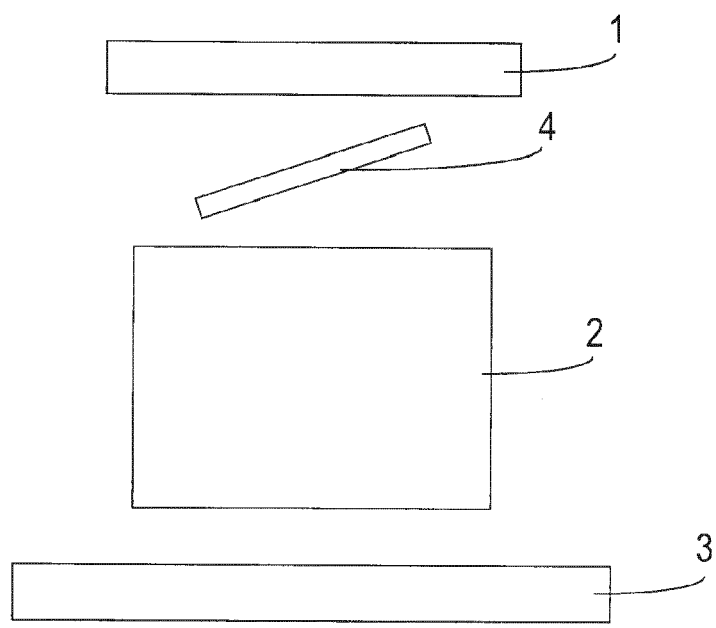
FIG. 3 is a schematic illustration of the embodiment of FIG. 2 showing tilting of the plate in a first direction.
Figure 4:
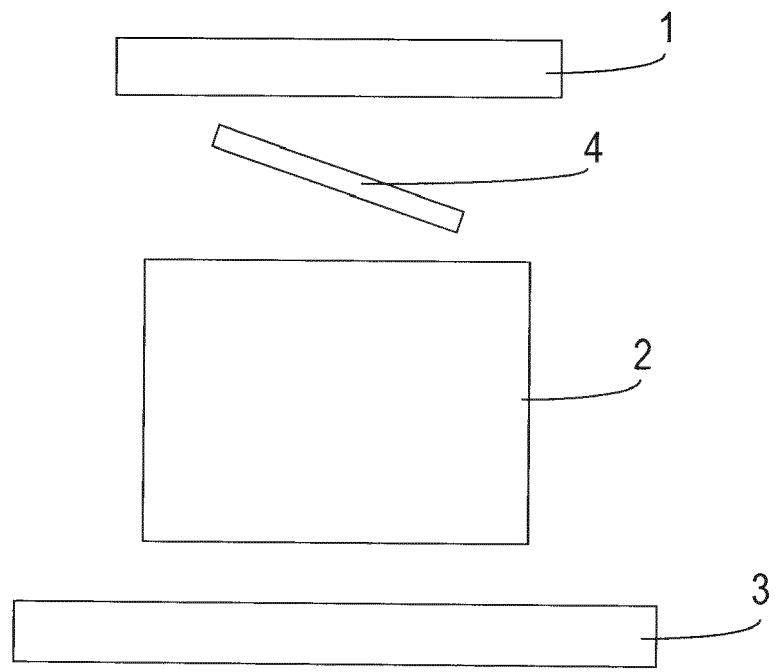
FIG. 4 is a schematic illustration of the embodiment of FIG. 2 showing tilting of the plate in a second direction.

FIG. 2 shows an embodiment of the invention. FIG. 2 shows very schematically a patterning device stage 1, a projection system 2 and a substrate stage 3. Located between the stage 1 and the projection system 2 is a plate 4 that may be adapted to tilt about both the X and Y directions (which are the directions perpendicular to the optical axis). FIGS. 3 and 4 show the tilting of the plate 4. By tilting the plate in the Y direction an image shift in the X direction will be created, while tilting the plate in the X direction will cause an image shift in the Y direction. It will of course be understood that the plate 4 may be tilted in both X and Y directions to produce a combined XY placement adjustment.

The plate may be of any desired thickness, e.g. from 1 mm to 10 mm. It will be understood that the extent of the tilt is very much exaggerated in FIGS. 3 and 4 for clarity. For example, a 120 mm long plate, with a thickness of 1 mm, may need to tilt only 0.013 degrees to correct for a 20 nm shift in the XY plane. A thicker plate would need to tilt even less. For example a 10 mm thick plate may need to tilt only 0.0013 degrees to correct for a 20 nm shift.

Figure 5:
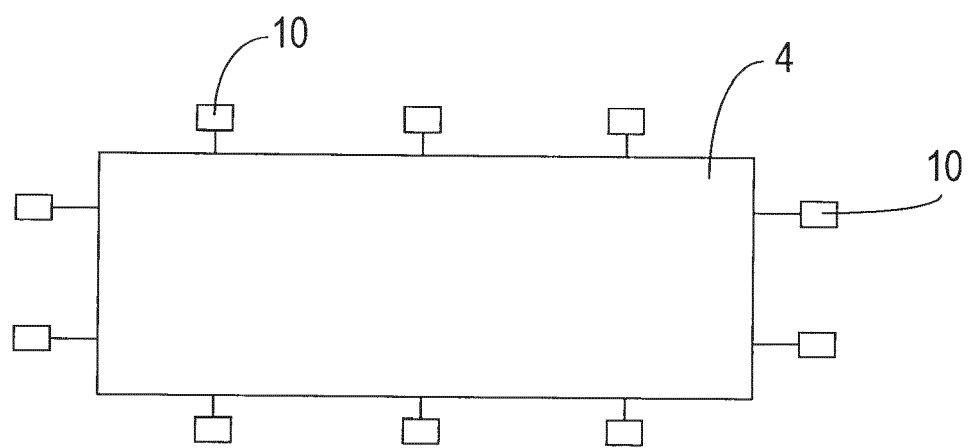
FIG. 5 is a schematic illustration of the embodiment of FIG. 2 in plan view.

The plate 4 may be made of any material that is transparent to the radiation in question, e.g. EUV radiation, and a suitable material would be glass. In an embodiment, the plate is made of a flexible material such that in addition to or instead of a tilting movement the plate can be bent which can cause a shift in the focus. In an embodiment, the plate is rectangular as shown in FIG. 5 and the bending of the plate can be created by one or more actuators 10 provided at one or more locations along one or more of the edges of the plate 4. The actuators may, for example, be piezoelectric actuators which are suitable because they can respond accurately and rapidly to control signals supplied by an image controller as will be discussed further herein.

The plate 4 should be located close to a field plane. The plate could therefore be close to the patterning device (as shown in the Figures) or could be close to the substrate. As an alternative, the plate could be located close to an intermediate or conjugate plane. The term "close to" in this context may be defined as meaning that there is no optical element with refractive power located between the plate and the intermediate or conjugate plane.

Figure 6:
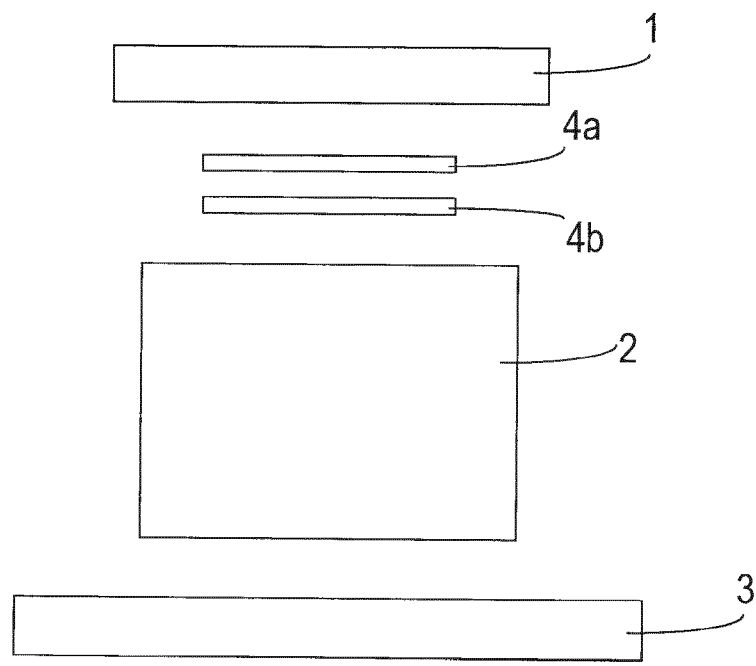
FIG. 6 is a schematic illustration of an embodiment of the invention.

FIG. 6 shows an embodiment in which the single plate of FIG. 2 is replaced by a pair of parallel rectangular plates 4a,4b. In an embodiment, the field plane may be located between the plates 4a,4b. This embodiment provides an extra degree of freedom allowing both XY position and focus position to be controlled. For example, one plate may be moved relative to the other or both plates may be moved together. Local variation in spacing between the plates may be provided by deforming at least one of the plates. Further, a gas or liquid may be provided between the plates. In an embodiment, the liquid is water. These different degrees of freedom can be considered in turn though in practice they may be combined to achieve a desired result.

Moving both plates together in the Z direction (i.e. along the optical axis) will have no effect but moving one plate relative to the other in the Z direction—while keeping the plates parallel—will change the focus position in the Z direction. Either the top plate or the bottom plate can be moved. At least one of the plates may be formed of a flexible material and may be caused to deform, for example by using one or more edge located (piezo-) actuators, thus causing a non-uniform spacing between the plates allowing for greater control of the focus location. In an embodiment, a liquid, e.g. water, is provided between the plates. This liquid will occupy the space that is created when one plate is deformed. When used, the liquid should be transparent to EUV radiation. Water is a suitable liquid for this purpose but another possible material may be used provided that it is transparent to the radiation in question. While the particular performance of the system will of course depend on the chosen design parameters, typically the sensitivity of the focus position to a change in the spacing between the plates is of the order of 20 nm/μm.

It should be noted that water (or other suitable liquid) may be supplied only to the space between the two plates, or alternatively the optical system may be an immersive one in which water (or other suitable liquid) is present throughout. In an embodiment where the liquid is supplied only to the space between the two plates one possible design constraint may be to keep the space between the plates substantially constant regardless of deformation of one of the plates such that at all times the space is filled with liquid. Alternatively a two-way supply of liquid may be provided to accommodate any increase or decrease in the space between the plates.

Another option provided by using water (or other suitable liquid) is that the liquid can be temperature controlled by the inclusion of a heater and/or cooler. This is useful because the refractive index varies as a function of temperature and thus by controlling the temperature the refractive index can be controlled. A change in the refractive index is equivalent to a change in the spacing between the plates.

An advantage provided by using water (or other suitable liquid) is that the water can be replaced at intervals and can therefore be used to flush out the space between the plates.

As noted above the plate(s) is desirably rectangular and conforms to the shape of the patterning device. There are a number of options regarding the location of the actuator(s). Some benefit may be obtained by providing an actuator along only one side of a plate, but desirably an actuator is provided along at least two orthogonal sides, and to provide the greatest degree of control and possible deformation of a plate the actuator may be provided along all four sides. The number of actuators per side may be chosen as a design constraint, but, in an embodiment, there will be fewer actuators along a side of the plate that extends substantially parallel to the scanned direction (which will be the shorter side of the plate if it conforms to the patterning device), and a greater number of actuators along the non-scanned direction.

As with the embodiment of FIG. 2 tilting of one or more plates may be used to provide XY position control. The two plates should desirably be tilted together in parallel. Tilting just one plate will result in a variation in the spacing between plates from one side of the plates to an opposite side resulting in loss of focus control. Tilting both plates by the same amount but in opposite directions will likewise involve a loss of focus control. Tilting of one plate only or tilting of both plates in opposite directions may, however, be possible to produce high resolution XY position control if a compensating action is taken with regard to the resultant defocus. Again, the precise performance characteristics of the system will depend on chosen design parameters, but typically if both plates are tilted in parallel the sensitivity of the shift in the XY plane is of the order of 159 nm/mrad.

All actuators—both those located on the edge(s) of a plate to generate a deformation of the plate, and used to tilt a plate or to move a plate along the Z axis—will receive control signals from a controller that receives position and focus information from a metrology system.

With regard to the above embodiment shown in FIG. 6 the ratio between the focus and the overlay sensitivities is a significant consideration. For example it would be desirable to be able to correct focus with little impact on overlay. A focus change is obtained by a local plate thickness change and a local plate curvature change; an XY placement change is due to a local plate tilt change (and a local plate wedge change). The placement change is further enhanced by the plate thickness (i.e. for a given plate tilt a thicker plate will result in a greater XY position change). This implies that to reduce the overlay sensitivity in order not to generate excessive XY error when changing the focus—the plate should be as thin as possible.

Figure 7:
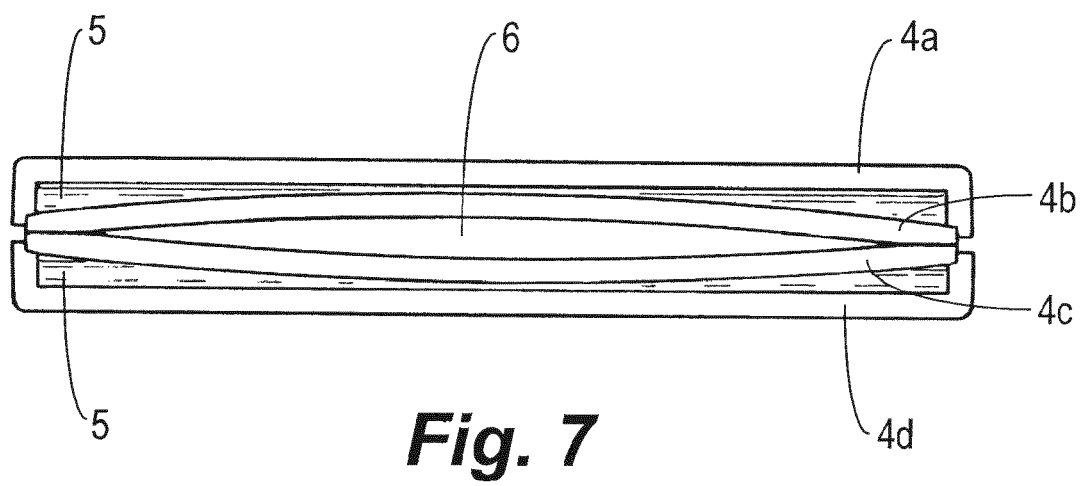
FIG. 7 is a schematic illustration of an embodiment of the invention.

FIG. 7 shows an embodiment in which there are four plates 4a-4d defining two pairs 4a,4b and 4c,4d. Between each pair is provided a liquid 5 such as water. Plate 4a which is closest to the patterning device, and plate 4d which is closest to the substrate, are both flat plates. Plates 4b,4c are both concave such that they define between them a lenticular space 6 which is filled with air (or other suitable gas) and which provides an optically active element. Plates 4a,4d are not manipulated, but one or more of plates 4b,4c may be manipulated by one or more actuators provided along one or more side edges as described above such that local deformation of the plate 4b,4c cause a change in curvature of the active element defined by the lenticular space 6. Because the manipulated element 4b,4c is relatively thin this embodiment allows for focus control without undue negative effect on the overlay. Other shapes for plates 4b,4c are possible and they could be, for example, convex or any desired free form shape.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
   a support structure configured to support a patterning device used to pattern a radiation beam;
   a substrate table constructed to hold a substrate;
   a projection system configured to project the patterned radiation beam onto a target portion of the substrate, the projection system having an optical axis; and
   a field manipulator comprising a pair of substantially parallel plates and an actuator configured to act on at least one of the plates, the field manipulator located at or close to a field plane or a conjugate plane thereof; and
   a control system configured to cause the actuator to act on the at least one plate to adjust the position of the radiation beam in a plane orthogonal to the optical axis, and to cause the actuator to act on the at least one plate to adjust the focus of the radiation beam.

2. The apparatus of claim 1, wherein the field manipulator is located between the projection system and the support structure.

3. The apparatus of claim 1, wherein the field manipulator is located between the projection system and the substrate table.

4. The apparatus of claim 1, wherein the actuator is configured to tilt the at least one about a direction to adjust the position of the radiation beam in an orthogonal direction.

5. The apparatus of claim 1, wherein the actuator is configured to deform the curvature of at least one of the plates to adjust the focus of the radiation beam.

6. The apparatus of claim 5, wherein the actuator comprises a plurality of actuators provided along at least one side edge of at least one of the plates.

7. The apparatus of claim 1, wherein the actuator is configured to vary the spacing between the plates.

8. The apparatus of claim 7, wherein the spacing between the plates is varied in a localized area only.

9. The apparatus of claim 8, wherein the localized spacing variation is provided by deforming at least one of the plates.

10. The apparatus of claim 1, comprising two pairs of plates with one plate in each pair facing each other, wherein at least one of the facing plates is connected to the actuator.

11. The apparatus of claim 10, wherein the facing plates define between them an optically active element.

12. The apparatus of claim 10, wherein the space between the facing plates is filled with a gas.

13. The apparatus of claim 12, wherein the facing plates are concave and define between them a lenticular space.

14. The apparatus of claim 1, wherein a gas or liquid is provided between the plates.

15. The apparatus of claim 14, wherein a liquid is provided between the plates and further comprising a controller to control the temperature of the liquid.

16. The apparatus of claim 1, further comprising a detector configured to detect a focus error and/or an overlay error, and the control system is a controller configured to control the actuator in response to a detected error.

17. A device manufacturing method, comprising:
   projecting a radiation beam patterned by a patterning device, using a projection system, onto a target portion of a substrate, the projection system having an optical axis; and
   adjusting the position of the radiation beam in a plane orthogonal to the optical axis by actuating at least one plate of a pair of substantially parallel plates in the beam path, the at least one plate located at or close to a field plane or a conjugate plane thereof; and
   adjusting the focus of the radiation beam by actuating the at least one plate of the pair of substantially parallel plates in the beam path.

18. The method of claim 17, wherein the actuating comprises tilting the at least one plate about a direction to adjust the position of the radiation beam in an orthogonal direction, deforming the curvature of at least one of the plates to adjust the focus of the radiation beam, and/or varying the spacing between the plates.

19. The method of claim 17, wherein the patterned radiation beam comprises extreme ultraviolet radiation.

20. The apparatus of claim 1, wherein the projection system is a reflective system designed for extreme ultraviolet radiation.

* * * * *